United States Patent
da Silva et al.

(10) Patent No.: US 8,890,727 B1
(45) Date of Patent: Nov. 18, 2014

(54) ANALOG-TO-DIGITAL CONVERTER CIRCUIT, INTEGRATED CIRCUIT, ELECTRONIC DEVICE AND METHOD THEREFOR

(71) Applicant: MediaTek Singapore Pte. Ltd., Singapore (SG)

(72) Inventors: José Barreiro da Silva, Woburn, MA (US); Stacy Ho, Reading, MA (US); Jeffrey Carl Gealow, Andover, MA (US)

(73) Assignee: MediaTek Singapore Pte. Ltd., Singapore (SG)

( * ) Notice: Subject to any disclaimer, the term of this patent is extended or adjusted under 35 U.S.C. 154(b) by 0 days.

(21) Appl. No.: 13/912,209

(22) Filed: Jun. 7, 2013

(51) Int. Cl.
*H03M 1/06* (2006.01)
(52) U.S. Cl.
CPC ...................................... *H03M 1/06* (2013.01)
USPC .......................................... 341/118; 341/155
(58) Field of Classification Search
CPC ........................................................ H03M 1/00
USPC .................................. 341/118, 155; 455/250.1
See application file for complete search history.

(56) References Cited

U.S. PATENT DOCUMENTS

2003/0083031 A1* 5/2003 Eriksson et al. ........... 455/250.1

OTHER PUBLICATIONS

Ultra-Low Power, Octal, 12-bit, 45 MSPS Sigma-Delta Analog-to-Digital Converter, pp. 1-46 and a page including "Important Notice", Texas Instruments Incorporated, 1999-2012.

* cited by examiner

*Primary Examiner* — Jean B Jeanglaude
(74) *Attorney, Agent, or Firm* — Winston Hsu; Scott Margo

(57) ABSTRACT

An automatic gain control circuit includes an input gain stage for receiving and amplifying an analog input signal; an analog-to-digital converter for receiving the amplified analog input signal and providing a digital output signal; and an overload management module. The overload management module is arranged to receive the digital output signal; determine therefrom whether the received, amplified analog input signal exceeds an operating range of the analog-to-digital converter; and provide a first control signal to the input gain stage to adjust a gain of the input gain stage in response thereto.

19 Claims, 6 Drawing Sheets

ANALOG-TO-DIGITAL CONVERTER CIRCUIT, INTEGRATED CIRCUIT, ELECTRONIC DEVICE AND METHOD THEREFOR

BACKGROUND

The field of this invention relates to an analog-to-digital converter (ADC) circuit, an integrated circuit, an electronic device such as a wireless communication unit and a method for managing an ADC overload condition. The invention is applicable to, but not limited to, an integrated circuit comprising an ADC for a wireless communication unit's modem application.

In the field of wireless communication systems and communication units, which comprise both transmitter and receiver functionality, a typical part of the receiver section is the Automatic Gain Control (AGC) loop. An AGC loop is generally used to keep signal levels adequate throughout the signal path, to avoid saturating any part of the receiver whilst maximizing a signal-to-noise ratio required for its optimum operating conditions. The AGC loop circuitry and any associated algorithm works by measuring power levels of received signals at the receiver output, checking if they are within desired limits, and if power levels of received signals are not within desired limits, using that information to update the gain controls of the various signal-processing blocks in the receiver path.

Normally, the AGC loop uses a slow-reacting algorithm: the power measurement is done over a relatively long frame of data, and the gain controls are updated shortly before the next signal/item of data/frame is received. The assumption is that any changes in signal amplitude are slower than the AGC loop response time. However, this is not always the case. In a number of scenarios, in particular in wireless communication applications, a desired signal is processed at the same time as a large undesired interferer. If the interferer has a large rise in amplitude, it can easily saturate the receiver chain, potentially causing a temporary loss of the desired signal, which may not be corrected until the next frame of data is received. Depending on how long the AGC loop takes to recover from this condition, the receiver may lose the communication link. If the received data is part of a voice call, this may cause the call to be dropped. In conventional implementations, the receiver section is designed to avoid any signal characteristics that the AGC loop cannot handle. This requires a more conservative level plan, which may for example assign extra headroom for the various blocks in the signal chain. Ultimately, this translates into more stringent dynamic-range requirements and higher power consumption.

Dependent upon where in the receiver chain the AGC loop is located, the AGC loop may contain an analog-to-digital converter (ADC). An ADC is a device that converts a continuous physical quantity (usually voltage) to a digital number that represents the quantity's amplitude. The conversion involves quantization of the input, so it necessarily introduces a small amount of error. Instead of performing a single conversion, an ADC often performs the conversions (for example "samples" the input) periodically. The result is a sequence of digital values that have converted a continuous-time and continuous-amplitude analog signal to a discrete-time and discrete-amplitude digital signal. An ADC may also provide an isolated measurement such as an electronic device that converts an input analog voltage or current to a digital number proportional to the magnitude of the voltage or current.

Figure 1:
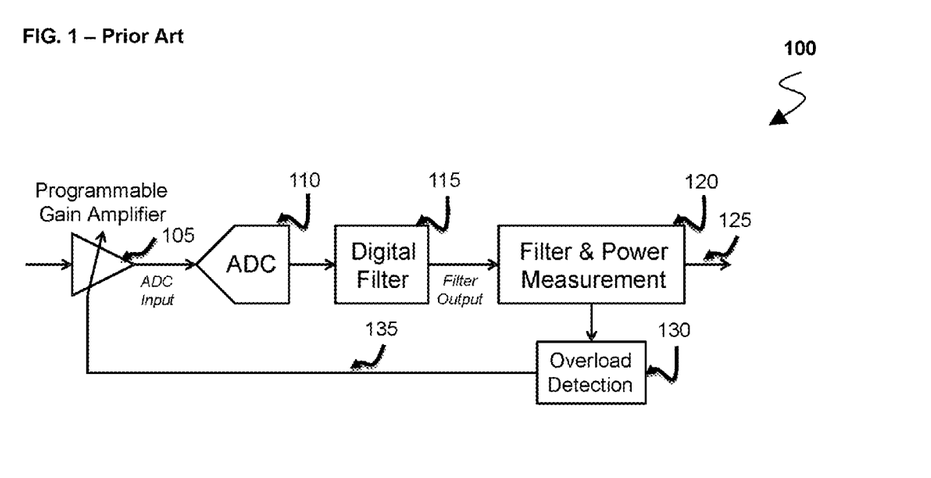
FIG. 1 illustrates a known architecture of a conventional analog-to-digital converter (ADC).

FIG. 1 illustrates a part of a receiver section 100 comprising an AGC loop. A Programmable Gain Amplifier (PGA) 105 represents the combined gain controls of the signal-conditioning blocks that precede the ADC 110. As an example, a receiver section may include a low-noise amplifier, a mixer, and a baseband filter before the ADC, and all of these blocks typically have such gain controls. The AGC loop 100 works to keep signal levels at the output 125 within optimum operation limits.

In order to do this, the AGC loop contains a digital filter 115 to filter the digitized signal output from the ADC 110. The output of the digital filter 115 is input to a filter and power measurement function 120, which outputs the filtered, digitized signal at output 125, as well as applying the filtered, digitized signal to an overload detection function 130. The overload detection function 130 then determines by how much to adjust the PGA 105 and provides a feedback automatic gain control signal 135.

Normally, the lower limit at the output 125 is selected to maintain a desired minimum signal-to-noise ratio, whilst the upper limit is set at a level that is safely below saturation. If the signal power is too low, the AGC loop 100 gradually increases the gain of the PGA 105 until the signal power is above the lower limit. If the signal power is too large, the AGC decreases the gain in the PGA 105 until it is below the upper limit.

Figure 2:
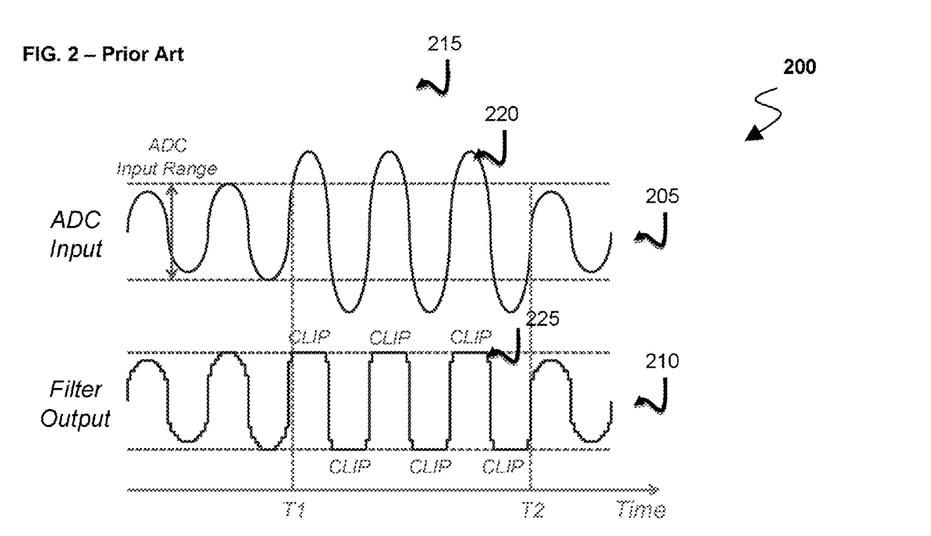
FIG. 2 illustrates a known signal behaviour of a conventional AGC loop.

An example of the signal behaviour of the circuit of FIG. 1 is shown in the waveform timing diagram 200 of FIG. 2. As illustrated, if the upper limit of the ADC input 205 is set too close to saturation, or if an unexpectedly large increase in signal power happens too quickly, the signal 220 from the PGA may be too large and saturate the ADC as shown at time T1 in period 215. Due to the time required for the AGC loop to determine that the signal power became too large, corrective action is only taken at time T2. Until then, throughout time period 215, any desired small signal component on top of the large signal is lost due to the ADC clipping 225 of the ADC input signal 220, as shown in the filter output waveform 210.

Figure 3:
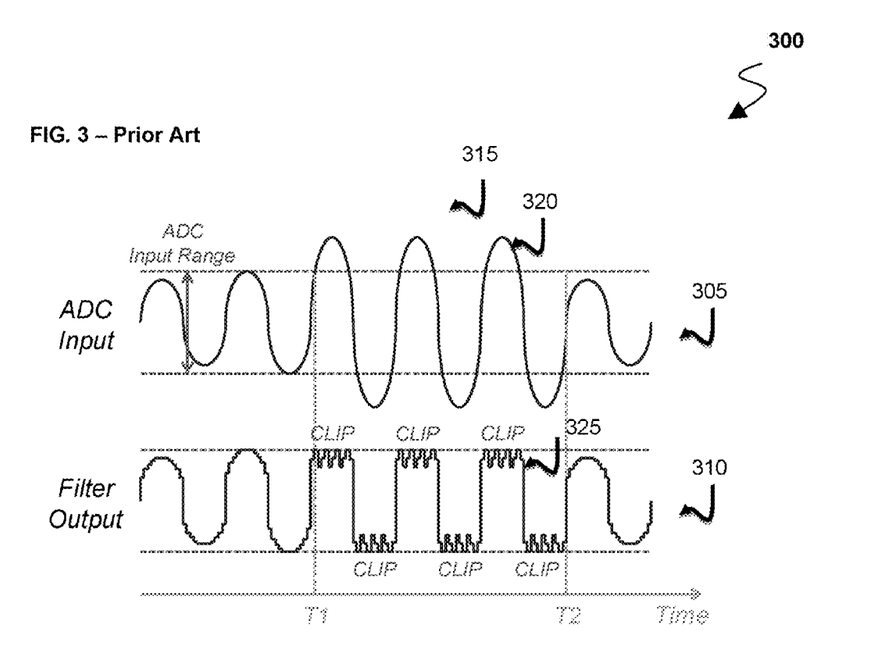
FIG. 3 illustrates a known signal behaviour of a conventional AGC with a sigma-delta ADC.

An additional complication may happen when the ADC is an oversampled delta-sigma converter, as illustrated in the waveform timing diagram 300 of FIG. 3 showing an alternative signal behaviour of the circuit of FIG. 1. As illustrated, if the upper limit of the ADC input 305 is set too close to saturation, or if an unexpectedly large increase in signal power happens too quickly, the signal 320 from the PGA may be too large and saturate the ADC as shown at time T1 in period 315. Due to the time required for the AGC loop to determine that the signal power became too large, corrective action is only taken at time T2. However, typically an oversampled delta-sigma ADC does not saturate with the simple clamping behaviour shown in FIG. 2. Instead, the oversampled delta-sigma ADC becomes unstable, and may require a reset of its internal integrator states to return to normal operation. However, as it attempts to recover, if the large input signal condition has not been removed, the ADC will repeatedly cycle between reset and recovery, as shown in the filter output waveform 310, and the resulting output may look ambiguous with regard to repetitive clipping 325 due to the AGC overload detection.

Thus, a need exists for an improved automatic gain control loop, for example with an ADC, an integrated circuit, electronic device (such as a wireless communication unit) and method of operation.

SUMMARY

Accordingly, the invention seeks to mitigate, alleviate or eliminate one or more of the above mentioned disadvantages, individually or in any combination. Aspects of the invention provide an analog-to-digital converter (ADC) circuit, an integrated circuit, an electronic device (such as a wireless communication unit) comprising such an ADC circuit, and a method therefor as described in the appended claims.

According to a first aspect of the invention, there is provided an automatic gain control circuit that comprises an input gain stage for receiving and amplifying an analog input signal; an analog-to-digital converter for receiving the amplified analog input signal and providing a digital output signal; and an overload management module. The overload management module is arranged to receive the digital output signal from the ADC; determine therefrom whether the received, amplified analog input signal exceeds an operating range of the analog-to-digital converter; and provide a first control signal to the input gain stage to adjust a gain of the input gain stage in response thereto.

Thus, in this manner, the provision of the overload management module forms a local loop AGC that implements a temporary solution to signal overload conditions. The provision of the overload management module enables the signal gain into an ADC to be controlled/operate faster than through provision of a global/wider AGC loop, and as such the overload management module may be arranged to prevent signal integrity issues that may otherwise happen before the AGC has time to adjust the overall gain of the system. Furthermore, the provision of the overload management module may effectively enable the ADC to operate over a higher input-signal range.

According to an optional feature of the invention, the overload management module may be arranged to receive the digital output signal directly from the output of the analog-to-digital converter, thereby forming a local AGC loop around the analog-to-digital converter.

According to an optional feature of the invention, an output gain stage may be operably coupled to the overload management module and an output of the analog-to-digital converter. The overload management module may be arranged to provide a control signal to the output gain stage to adjust a gain of the output gain stage in response to whether the received, amplified analog input signal exceeds an operating range of the analog-to-digital converter. In this manner, the signal integrity may be maintained though use of both input and output gain stages.

According to an optional feature of the invention, the overload management module may be arranged to provide a control signal to the output gain stage to effect a reciprocal gain of the output gain stage to the gain of the input gain stage. In this manner, a seamless operation of the technique when switching between an overload condition and a normal mode of operation may be maintained.

According to an optional feature of the invention, a digital filter may be located between the analog-to-digital converter and the output gain stage; and a delay module may be operably coupled between the overload management module and the output gain stage and arranged to delay the control signal to the output gain stage to compensate for signal propagation latency introduced by the digital filter. In this manner, the delay module may be able to compensate for any signal propagation latency introduced by the digital filter (as well as taking into account any corresponding delays in the ADC and overload management module. Additionally, the digital filter may remove the high-frequency terms output from the analog to digital converter. The delay module may also be configured to match the digital filter delay to prevent any temporary mismatch between input and output gains.

According to an optional feature of the invention, the overload management module may be arranged to determine whether the received, amplified analog input signal no longer exceeds an operating range of the analog-to-digital converter, and in response thereto may provide a second control signal to the input gain stage to re-adjust the gain of the input gain stage. In this manner, the overload management module may return the ADC operation quickly back to its normal mode of operation, with optimal signal swing range and low-noise behaviour.

According to an optional feature of the invention, the analog-to-digital converter may comprise an input gain stage. In this manner, the overload management module may more accurately set the signal gain of signals entering the ADC conversion part.

According to an optional feature of the invention, the overload management module may comprise an overload detection module arranged to determine by how much to adjust the gain stage. In this manner, the overload detection module may more accurately set the signal gain of signals entering the ADC conversion part.

According to an optional feature of the invention, the overload detection module may be arranged to provide a feedback automatic gain control signal to a second global automatic gain control loop located outside of a first inner automatic gain control loop that is located around the analogue to digital converter. In this manner, the overload detection module may provide information to a wider (than purely an ADC part) automatic gain control arrangement, in order to more accurately set the signal gain of signals within an AGC loop.

According to an optional feature of the invention, the overload management module may be arranged to temporarily restrict a signal swing of the analog input signal prior to inputting to analog-to-digital converter. In this manner, the overload detection module may be able to improve the ADC operation range and signal conversion granularity to reflect the magnitude/amplitude of the signal being provided to the ADC.

According to an optional feature of the invention, the overload management module may be arranged, upon determining that amplified analog input signal exceeds an operating range of the analog-to-digital converter, to generate an overload indicator signal that functions in at least one from a group comprising: indicates the amplified analog input signal exceeds an operating range of the analog-to-digital converter; is used as an interrupt signal; identifies to the global AGC loop that the source of the exceeding analog input signal is located before the input gain stage. In this manner, the global AGC module may be able to control the gain performance of the gain stages that precede the ADC.

According to an optional feature of the invention, the overload management module may be arranged, after the global AGC loop has taken action to reduce a gain of a stage preceding the ADC, to generate an overload clear signal to remove an overload condition.

According to an optional feature of the invention, the analog-to-digital converter comprises an impedance network providing at least two selectable paths to the analog-to-digital converter. At least a first selectable path of the two selectable paths to the analog-to-digital converter may be for use in normal operation of the analog-to-digital converter and a second selectable path to the analog-to-digital converter may be for use in an overload condition mode of operation of the analog-to-digital converter. In this manner, the overload detection module may be able to provide input gain control in the ADC with minimal circuit/component modifications required of, say, the ADC.

According to an optional feature of the invention, the analog-to-digital converter may comprise one from a group of: continuous-time delta-sigma analog-to-digital converter or discrete-time analog-to-digital converter.

According to a second aspect of the invention, there is provided an integrated circuit device comprising the automatic gain control circuit according to the first aspect of the invention.

According to a third aspect of the invention, there is provided an electronic device, for example a wireless communication unit comprising the automatic gain control circuit according to the first aspect of the invention.

According to a fourth aspect of the invention, there is provided a method of providing automatic gain control. The method comprises receiving and amplifying an analog input signal at an input gain stage of an automatic gain control circuit; performing analog-to-digital conversion of the amplified analog input signal; and receiving a digital output signal. The method further comprises determining therefrom whether the received, amplified analog input signal exceeds an operating range of the analog-to-digital converter; and providing a control signal to the input gain stage; and adjusting a gain of the input gain stage in response thereto.

These and other aspects of the invention will be apparent from, and elucidated with reference to, the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale. Like reference numerals have been included in the respective drawings to ease understanding.

DETAILED DESCRIPTION

Examples of the invention will be described in terms of an integrated circuit comprising an automatic gain control circuit (AGC) comprising an analog-to-digital converter (ADC) portion for an electronic device, such as a wireless communication unit and method of automatic gain control therefor. Examples of the invention will be described with reference to an application for an AGC within a receiver architecture within either a wireless communication unit such as a base station (referred to as a Node-B in a $3^{rd}$ generation partnership project (3GPP™) communication standard within the universal mobile telecommunication system (UMTS™)) or in a subscriber wireless communication unit (referred to as a user equipment (UE) in 3GPP™) where the AGC is used to adjust their received signal power levels. However, it is envisaged that the inventive concept herein described may be embodied in any type of architecture or circuit, and need not be limited to an integrated circuit or wireless communication unit, per se. For example, the concepts described herein may be embodied within an AGC employed in any electronic circuit where an average output signal level is fed back to an input in order to adjust a gain of the signal level to an appropriate level for a range of input signal levels.

In examples of the invention, an AGC circuit comprising an ADC, which may form part of an integrated circuit, and a method therefor are described to gracefully recover from a saturation condition without losing signal information. Although the AGC circuit is described within the framework of a downlink AGC, which is an important component of the receiver chain, it is envisaged that the concepts described herein may be applied to other signal-processing blocks.

Figure 4:
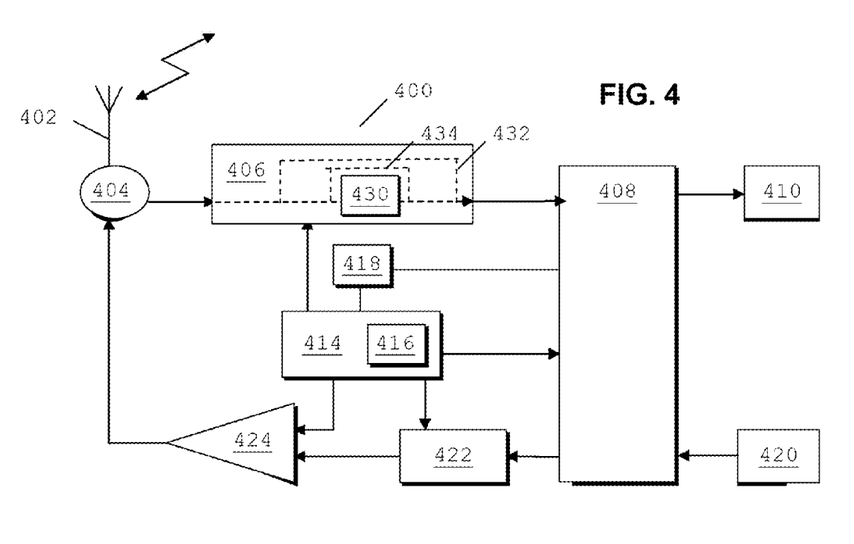
FIG. 4 illustrates a simplified example block diagram of a wireless communication unit adapted to support examples of the invention.

Referring first to FIG. 4, an example block diagram of a wireless communication unit (in the context of the present invention described with reference to a mobile subscriber unit (mobile station (MS) or user equipment (UE, in $3^{rd}$ generation partnership project (3GPP™) parlance)), is shown, in accordance with an example embodiment of the invention. The wireless communication unit 400 contains an antenna 402 coupled to a duplex filter or antenna switch 404 that provides isolation between receive and transmit chains within the wireless communication unit 400. The receiver chain, as known in the art, includes receiver circuitry 406 (effectively providing front-end reception, filtering and intermediate or base-band frequency conversion). The receiver circuitry 406 is serially coupled to a signal processor 408. In accordance with examples of the invention, the receiver circuitry 406 also includes an analog-to-digital converter 430 with a first local automatic gain control loop 434 located directly around the analog-to-digital converter 430 and a second global automatic gain control loop 432 located around multiple receiver chain components and devices. An output from the signal processor 408 is provided to a suitable output device 410, such as a screen or flat panel display. The receiver chain is coupled to a controller 414 that maintains overall subscriber unit control. The controller 414 is also coupled to a signal processor 408 (generally realised by a digital signal processor (DSP)). The controller 414 is also coupled to (or comprises) a memory device 416 that selectively stores operating regimes, such as decoding/encoding functions, synchronisation patterns, code sequences, and the like. In accordance with some examples of the invention, the memory device 416 may be adapted to store information with regard to a relationship, for example in terms of one or more equations or voltage values of various circuit components or circuit elements in the feedback path, as later described.

As regards the transmit chain, this essentially includes an input device 420, such as a keypad, coupled in series through a signal processor 408 and transmitter/modulation circuitry 422 (that may include up-conversion circuitry and amplifier and filtering stages) and a power amplifier 424 to the antenna 402. The transmitter/modulation circuitry 422 and the power amplifier 424 are operationally responsive to the controller 414. The output of the power amplifier 424 is connected to antenna 402 via duplex filter 404.

The signal processor in the transmit chain may be implemented as distinct from a different signal processor in the receive chain. Alternatively, a single processor may be used to implement processing of both transmit and receive signals, as shown in FIG. 4. Clearly, the various components within the wireless communication unit 400 can be realised in discrete or integrated component form, with an ultimate structure therefore being merely an application-specific or design selection. In accordance with examples of the invention, the receiver circuitry 406 has been adapted to comprise an improved automatic gain control loop, for example employing an ADC and accommodating the signal variations that can affect a performance of the ADC. In accordance with examples of the invention, a provision of an overload management module may form a local loop AGC that implements a temporary solution to signal overload conditions that can affect a performance of the ADC. The provision of the overload management module may enable the signal gain into an ADC to be controlled/operate faster than through provision of a global/wider AGC loop, and as such the overload management module may be arranged to prevent signal integrity issues that may otherwise happen before the AGC has time to adjust the overall gain of the system.

Figure 5:
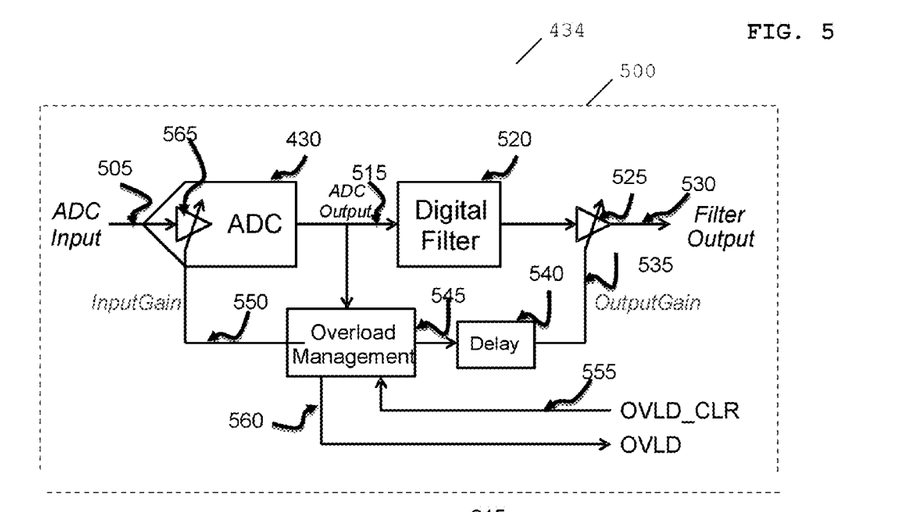
FIG. 5 illustrates a simplified example block diagram of an analog-to-digital converter (ADC) circuit with overload management functionality adapted to support examples of the invention.

In some example embodiments, and referring now to a more detailed description of a portion of the first local automatic gain control loop 434 located directly around the analog-to-digital converter 430 of FIG. 4, FIG. 5 illustrates an ADC overload management architecture. In some examples, the ADC overload management architecture may be provided on a single Integrated Circuit (IC) 500. The corresponding portion of the first local automatic gain control loop 434 comprises an input 505 to an ADC 430. The output 515 of the ADC 430 is input to a digital filter 520 to remove the high-frequency terms and the digitally filtered signal is then applied to a variable gain module 525 that scales the digital filtered output signal; e.g. it uses as much of the ADC input range as is practically possible. The output 530 of the variable gain module 525 comprises a digital, amplified and filtered representation of the ADC input signal 505.

In accordance with examples of the invention, the output 515 of the ADC 430 is also input into an overload management module 545, which in some examples may form part of the signal processor 408 of FIG. 4. In accordance with examples of the invention, the purpose of the overload management module 545 is to provide a local loop AGC that implements a temporary solution to signal overload conditions. Since it operates faster than a global/wider AGC loop, the overload management module 545 may be arranged to prevent signal integrity issues that may otherwise happen before the AGC has time to adjust the overall gain of the system.

In this illustrated example, the overload management module 545 comprises an input control signal (OVLD_CLR) 555 and an output control signal (OVLD) 560. In this example, the overload management module 545 is also operably coupled to a new input gain stage 565 in the ADC 430, in order to set a gain thereof via 'InputGain' control signal 550. In some examples, output gain stage 525 may comprise a self-contained, configurable switch to route the digital filter output directly out or via the output gain amplifier. In some examples, output gain stage 525 may be configured to implement a gain of one (which means a direct connection to the output), or another gain (which means that the output receives an amplified version). In this example, the overload management module 545 is also operably coupled to the new variable output gain stage 525, in order to set a gain thereof via 'OutputGain' control signal 535. The 'OutputGain' control signal 535 passes through a delay module 540 to compensate for any signal propagation latency introduced by the digital filter 520 (as well as taking into account any corresponding delays in ADC 430 and overload management module 545). If the OutputGain control is changed too early, the output of the digital filter 520 will temporarily show a transient with a smaller version of the processed signal. If the change happens too late, the digital filter 520 will show a larger version. Hence, in some examples, the delay line may be configured to match the digital filter delay to prevent this temporary mismatch between input and output gains.

In operation, overload management module 545 is arranged to monitor the ADC output 515 for saturation conditions. If the ADC 430 is operating within its normal operation range, an overload detection circuit (not shown) within the overload management module 545 makes no change. However, if the ADC 430 saturates, the overload management module 545 is arranged to perform the following:

It changes the 'InputGain' control signal 550 to reduce the effective swing of the input-signal 505 into the ADC 430.

It changes the 'OutputGain' control signal 535 to compensate for the signal reduction at the output of the digital filter 520.

It asserts the OVLD output signal 560, indicating to the global (and relatively slow-reacting) AGC loop (not shown) that takes care of the gain controls for the complete receiver chain that an overload condition exists.

In this example configuration, the ADC 430 effectively operates over a higher input-signal range. In this example configuration, however, the ADC 430 also has an effectively higher noise floor, such that the overload condition still needs to be corrected. However, these actions maintain the integrity of the digitally converted signal, therefore preventing loss of information in the receiver chain.

The OVLD indicator signal 560 is used to alert the AGC loop that there is an overload condition. In some examples, this signal may be redundant since the AGC loop eventually will detect this condition by itself. However, in some examples, the OVLD indicator signal 560 may be used as an interrupt if immediate action is preferred. In some examples, the OVLD indicator signal 560 may also make it clear that the source of the issue is located before the input to the ADC 430. With this information, the AGC can still take action at any time to correct the problem, for example by reducing the gain in the circuits that precede the ADC 430. Once those gain controls are updated, the AGC uses the input control OVLD-_CLR 555 to remove the overload condition from the ADC 430, therefore returning it to its normal operating conditions.

In some examples, for example to maintain seamless operation of the technique, the input and output gains may be configured as being reciprocal, so that the effective gain during overload is the same as during normal operation. That is to say, the following condition is satisfied:

$$\text{outputGain} = 1/\text{inputGain} \qquad [1]$$

In some examples of the invention, the input gain control in the ADC may be implemented with minimal circuit modifications. In one example, the ADC 430 (for example a continuous-time delta-sigma ADC) may be implemented with an input stage that contains an impedance dividing network, which may comprise a resistor network or a capacitive network. A resistor network may comprise a selection between two (or multiple) different sets of input resistors: one resistor set for normal operation, and at least one larger set for operation during overload, the appropriate input gain control provided by a respective set of resistors can be readily selected by overload management module 545. In alternative examples, where switched-capacitor based input stages (common for discrete-time ADCs) may be used, a set (from multiple sets) of input-sampling capacitors may be selected by overload management module 545 for an overload condition.

In some instances, a selection of a suitable impedance set may be made based on the detected magnitude of the overload condition. If the ADC continues to show an overload condition after reducing the input gain, the overload detector can select another impedance set that provides further gain reductions.

Within overload management module 545, it is envisaged that there may be multiple ways of implementing an ADC overload detector. In one example, a number of consecutive minimum or maximum output codes may be counted by a counter and signal processor arrangement, with the signal processor flagging an overload condition once a predetermined number is reached.

The output gain control of the overload management module 545 is implemented in the digital domain. Here, the overload management module 545 selects between a filter output and an amplified version (multiplied by a constant) of the filter output. In its simplest form in one example, the multiplication factor may be a power of two, in which case the output gain is a left-shifted version of the filter output. As will be appreciated by a skilled artisan, performing calculations on digital signals, and exploring some properties to make the implementation easier in some examples, such as multiplying digital numbers by a power of two (2, 4, 8, etc.) may be advantageous. For example, the number five can be represented as the 4-bit number '0101'. If this number is multiplied by two, the result will be ten, represented as '1010', which is five with a zero inserted on the right side, or in other words, simply a 'left-shifted' version of '0101'. This is a very simple operation that does not require any hardware.

Figure 6:
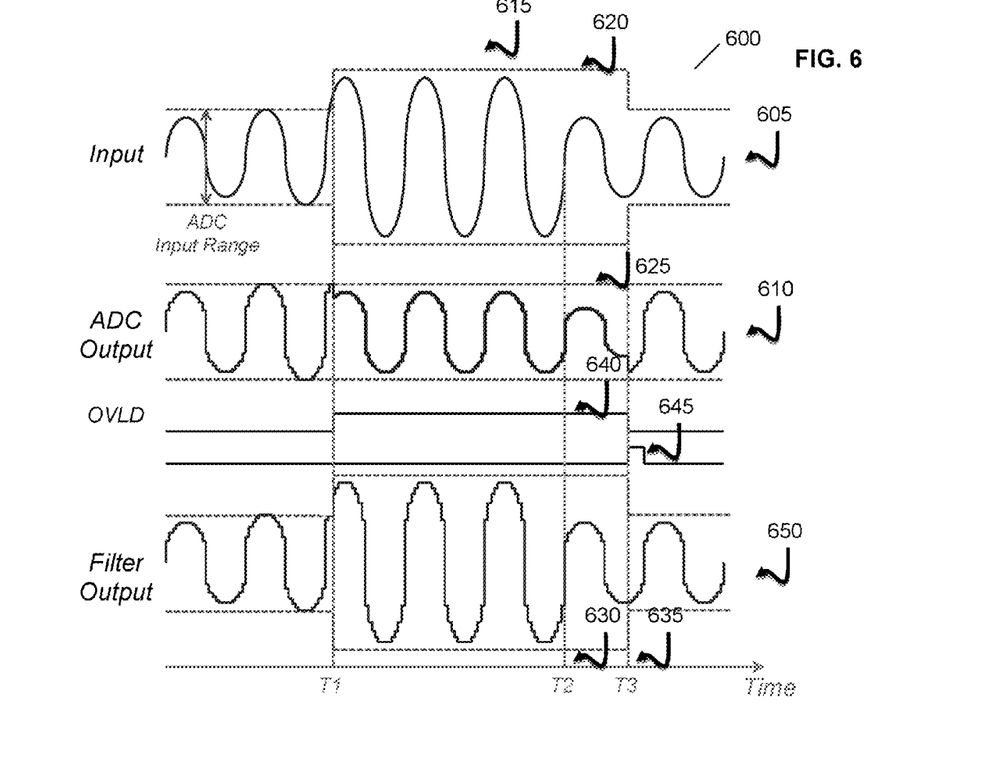
FIG. 6 illustrates a signal behaviour of an ADC circuit with overload management functionality in accordance with examples of the invention.

FIG. 6 illustrates a signal behaviour diagram 600 of an ADC circuit with overload management functionality in accordance with examples of the invention. For simplicity, it is assumed that there is no latency in the digital filter.

Before time T1, the ADC is operating with its normal input range. At time T1, as illustrated, the input signal goes out of range, for example if the ADC input 605 is set too close to saturation, or if an unexpectedly large increase in signal power happens too quickly. In accordance with example embodiments of the invention, an overload management module, such as overload management module 545 of FIG. 5, determines that a saturation condition has occurred. In response thereto, an input gain stage to the ADC, such as input gain stage 565 of FIG. 5, is adjusted by overload management module in order to reduce 625 the level of the ADC input signal and consequently the level of the ADC output signal 610, during period 615, as illustrated. As mentioned previously with respect to FIG. 5, a corresponding output stage may also be adjusted (increased), and OVLD may be asserted high 640. In this manner, the signal level 610 is reduced such that it is no longer too large and saturates the ADC. This is in contrast to the known signal behavior in FIG. 2.

At time T2 630 the AGC system takes action to reduce the signal gain before the ADC, so that the signal swing is able to return to its desired level. Shortly after that, at time T3 635, the AGC system uses OVLD_CLR control signal (e.g. a pulse) 645 to remove the overload condition. The overload management module responds by changing the input and output gain controls to their default values.

As illustrated, the filter output waveform 650 in FIG. 6, follow the ADC input waveform 605 as the filter output is taken after the output gain block.

Figure 7:
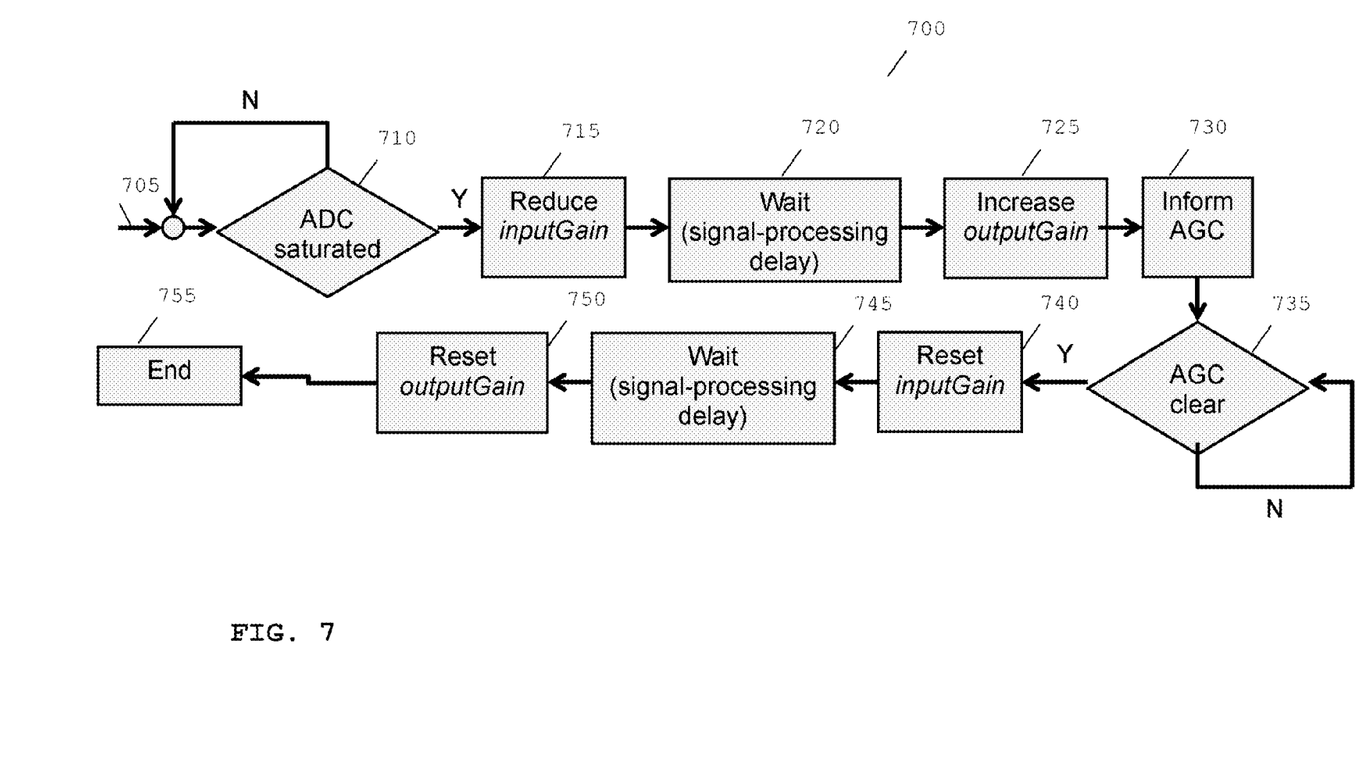
FIG. 7 illustrates an example flowchart of an ADC circuit employing overload management functionality in accordance with examples of the invention.

Referring now to FIG. 7, an example flowchart 700 of steps employed by an ADC circuit employing overload management functionality is illustrated in accordance with examples of the invention. The flowchart commences with an input analog signal being received and amplified by an input gain stage of an automatic gain control circuit at 705. At 710 analog-to-digital conversion of the amplified analog input signal is performed and a determination is made, for example by the overload management module 545 of FIG. 5, as to whether the ADC will be saturated by the input analog signal.

If the ADC will not be saturated by the input analog signal in 710, the ADC functions in its normal operating manner. However, if it is determined at 710 that the ADC will be saturated by the input analog signal, the process moves to 715 whereby a control signal 'InputGain' is applied to an input gain stage of the ADC, and the gain reduced, for example set by an input gain stage such as input gain stage 565 of FIG. 5.

A delay may then ensue at 720, for example due to signal processing operations. At 725, the OutputGain from the ADC, for example via a digital filter and set at an output gain stage such as output gain stage 525 of FIG. 5, is increased. In this manner, to maintain seamless operation of the technique, the input and output gains may be configured as being reciprocal, so that the effective gain during overload is the same as during normal operation.

At 730, an automatic gain control (AGC) module is informed of the overload condition and the response made thereto. At 735, a determination is made, for example by the overload management module 545 of FIG. 5 or an AGC module, as to whether the overload condition is still in place. If it is determined that the overload condition is still in place, the process loops at 735. If it is determined that the overload condition is no longer in effect, the process transitions and the reverse operation begins. In this regard, InputGain into the ADC, for example set by the input gain stage such as input gain stage 565 of FIG. 5, is reset (i.e. increased) at 740. A delay may then ensue at 745, for example due to signal processing operations. At 750, the OutputGain from the ADC is also reset, for example output gain stage such as output gain stage 525 of FIG. 5, is reduced. The process then ends at 755.

In some examples, some or all of the steps illustrated in the flowchart of FIG. 7 may be implemented in hardware and/or some or all of the steps illustrated in the flowchart may be implemented in software or firmware.

A skilled artisan will appreciate that in other applications, alternative functions/circuits/devices and/or other ADC or AGC techniques may be used. For example, although examples of the invention have been described with reference to the overload management module comprising a signal processor, in other examples the overload management module may comprise firmware or hardware and/or logic, say in the form of a field programmable gate array.

Although examples of the invention have been described with reference to an overload condition detector employed in an overload management module, it is envisaged that the inventive concept may be applied in alternative detector applications that are not necessarily limited to an ADC output level (or power) detector. In some examples, the architecture described in FIG. 5 may be a discrete component/circuit-based implementation.

In particular, it is envisaged that the aforementioned inventive concept can be applied by a semiconductor manufacturer to any integrated circuit comprising an ADC and a signal level detector. Furthermore, it is further envisaged that, for example, the inventive concept may be applied by a semiconductor manufacturer in a design of a stand-alone detector device, or application-specific integrated circuit (ASIC) and/or any other sub-system element.

It will be appreciated that, for clarity purposes, the above description has described embodiments of the invention with reference to different functional units and processors. However, it will be apparent that any suitable distribution of functionality between different functional units or processors, for example with respect to the overload management module and/or ADC may be used without detracting from the invention. For example, functionality illustrated to be performed by separate processors or controllers may be performed by the same processor or controller. Hence, references to specific functional units are only to be seen as references to suitable means for providing the described functionality, rather than indicative of a strict logical or physical structure or organization.

Figure 8:
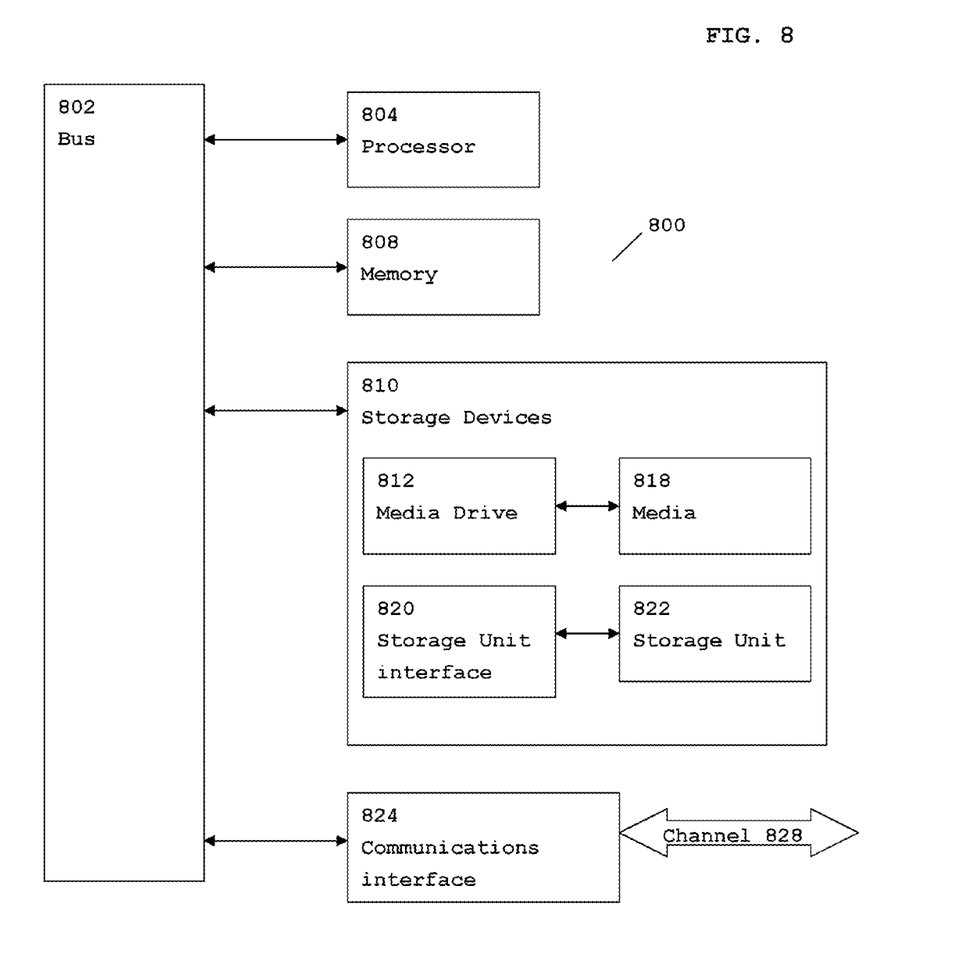
FIG. 8 illustrates a typical computing system that may be employed to implement signal processing functionality in embodiments of the invention.

Referring now to FIG. 8, there is illustrated a typical computing system 800 that may be employed to implement signal processing functionality in embodiments of the invention. Computing systems of this type may be used in access points and wireless communication units. Those skilled in the relevant art will also recognize how to implement the invention using other computer systems or architectures. Computing system 800 may represent, for example, any general purpose computing device as may be desirable or appropriate for a given application or environment. Computing system 800 can include one or more processors, such as a processor 804. Processor 804 can be implemented using a general or special-purpose processing engine such as, for example, a microprocessor, microcontroller or other control module. In this example, processor 804 is connected to a bus 802 or other communications medium.

Computing system 800 can also include a main memory 808, such as random access memory (RAM) or other dynamic memory, for storing information and instructions to be executed by processor 804. Main memory 808 also may be used for storing temporary variables or other intermediate information during execution of instructions to be executed by processor 804. Computing system 800 may likewise include a read only memory (ROM) or other static storage device coupled to bus 802 for storing static information and instructions for processor 804.

The computing system 800 may also include information storage system 810, which may include, for example, a media drive 812 and a removable storage interface 820. The media drive 812 may include a drive or other mechanism to support fixed or removable storage media, such as a hard disk drive, a floppy disk drive, a magnetic tape drive, an optical disk drive, a compact disc (CD) or digital video drive (DVD) read or write drive (R or RW), or other removable or fixed media drive. Storage media 818 may include, for example, a hard disk, floppy disk, magnetic tape, optical disk, CD or DVD, or other fixed or removable medium that is read by and written to by media drive 812. As these examples illustrate, the storage media 818 may include a computer-readable storage medium having particular computer software or data stored therein.

In alternative embodiments, information storage system 810 may include other similar components for allowing computer programs or other instructions or data to be loaded into computing system 800. Such components may include, for example, a removable storage unit 822 and an interface 820, such as a program cartridge and cartridge interface, a removable memory (for example, a flash memory or other removable memory module) and memory slot, and other removable storage units 822 and interfaces 820 that allow software and data to be transferred from the removable storage unit 818 to computing system 800.

Computing system 800 can also include a communications interface 824. Communications interface 824 can be used to allow software and data to be transferred between computing system 800 and external devices. Examples of communications interface 824 can include a modem, a network interface (such as an Ethernet or other NIC card), a communications port (such as for example, a universal serial bus (USB) port), a PCMCIA slot and card, etc. Software and data transferred via communications interface 824 are in the form of signals which can be electronic, electromagnetic, and optical or other signals capable of being received by communications interface 824. These signals are provided to communications interface 824 via a channel 828. This channel 828 may carry signals and may be implemented using a wireless medium, wire or cable, fiber optics, or other communications medium. Some examples of a channel include a phone line, a cellular phone link, an RF link, a network interface, a local or wide area network, and other communications channels.

In this document, the terms 'computer program product', 'computer-readable medium' and the like may be used generally to refer to media such as, for example, memory 808, storage device 818, or storage unit 822. These and other forms of computer-readable media may store one or more instructions for use by processor 804, to cause the processor to perform specified operations. Such instructions, generally referred to as 'computer program code' (which may be grouped in the form of computer programs or other groupings), when executed, enable the computing system 800 to perform functions of embodiments of the present invention. Note that the code may directly cause the processor to perform specified operations, be compiled to do so, and/or be combined with other software, hardware, and/or firmware elements (e.g., libraries for performing standard functions) to do so.

In an embodiment where the elements are implemented using software, the software may be stored in a computer-readable medium and loaded into computing system 800 using, for example, removable storage drive 822, drive 812 or communications interface 824. The control module (in this example, software instructions or computer program code), when executed by the processor 804, causes the processor 804 to perform the functions of the invention as described herein.

Aspects of the invention may be implemented in any suitable form including hardware, software, firmware or any combination of these. The invention may optionally be implemented, at least partly, as computer software running on one or more data processors and/or digital signal processors or configurable module components such as field programmable gate array (FPGA) devices. Thus, the elements and components of an embodiment of the invention may be physically, functionally and logically implemented in any suitable way. Indeed, the functionality may be implemented in a single unit, in a plurality of units or as part of other functional units.

Although the present invention has been described in connection with some embodiments, it is not intended to be limited to the specific form set forth herein. Rather, the scope of the present invention is limited only by the accompanying claims. Additionally, although a feature may appear to be described in connection with particular embodiments, one skilled in the art would recognize that various features of the described embodiments may be combined in accordance with the invention. In the claims, the term 'comprising' does not exclude the presence of other elements or steps.

Furthermore, although individually listed, a plurality of means, elements or method steps may be implemented by, for example, a single unit or processor. Additionally, although individual features may be included in different claims, these may possibly be advantageously combined, and the inclusion in different claims does not imply that a combination of features is not feasible and/or advantageous. Also, the inclusion of a feature in one category of claims does not imply a limitation to this category, but rather indicates that the feature is equally applicable to other claim categories, as appropriate.

Furthermore, the order of features in the claims does not imply any specific order in which the features must be performed and in particular the order of individual steps in a method claim does not imply that the steps must be performed in this order. Rather, the steps may be performed in any suitable order. In addition, singular references do not exclude a plurality. Thus, references to 'a', 'an', 'first', 'second', etc., do not preclude a plurality.

Thus, an improved automatic gain control loop, for example with an ADC, an integrated circuit, electronic device (such as a wireless communication unit) and method of operation have been described, wherein the aforementioned disadvantages with prior art arrangements have been substantially alleviated.

What is claimed is:

1. An automatic gain control circuit comprising:
   an input gain stage for receiving and amplifying an analog input signal;
   an analog-to-digital converter for receiving the amplified analog input signal and providing a digital output signal; and
   an overload management module arranged to:
      receive the digital output signal from the analog-to-digital converter;
      determine therefrom whether the received, amplified analog input signal exceeds an operating range of the analog-to-digital converter; and
      provide a first control signal to the input gain stage to adjust a gain of the input gain stage in response thereto;
   wherein the overload management module is arranged to receive the digital output signal directly from the output of the analog-to-digital converter.

2. The automatic gain control circuit of claim 1 wherein the overload management module is arranged to determine whether the received, amplified analog input signal no longer exceeds an operating range of the analog-to-digital converter, and in response thereto provide a second control signal to the input gain stage to re-adjust the gain of the input gain stage.

3. The automatic gain control circuit of claim 1 wherein the analog-to-digital converter comprises the input gain stage.

4. The automatic gain control circuit of claim 1 wherein the overload management module comprises an overload detection module arranged to determine by how much to adjust the gain stage.

5. The automatic gain control circuit of claim 1 wherein the overload management module is arranged to temporarily restrict a signal swing of the analog input signal prior to inputting to analog-to-digital converter.

6. The automatic gain control circuit of claim 1 wherein the analog-to-digital converter comprises an impedance network providing at least a first selectable path of the two selectable paths to the analog-to-digital converter for use in normal operation of the analog-to-digital converter and a second selectable path to the analog-to-digital converter for use in an overload condition mode of operation of the analog-to-digital converter.

7. The automatic gain control circuit of claim 1 wherein the analog-to-digital converter comprises one from a group of: continuous-time delta-sigma analog-to-digital converter, discrete-time analog-to-digital converter.

8. An integrated circuit comprising the automatic gain control circuit of claim 1.

9. An electronic device comprising the automatic gain control circuit of claim 1.

10. The electronic device of claim 9 wherein the electronic device is a wireless communication unit.

11. An automatic gain control circuit comprising:
    an input gain stage for receiving and amplifying an analog input signal;
    an analog-to-digital converter for receiving the amplified analog input signal and providing a digital output signal;
    an overload management module arranged to:
       receive the digital output signal from the analog-to-digital converter;
       determine therefrom whether the received, amplified analog input signal exceeds an operating range of the analog-to-digital converter; and
       provide a first control signal to the input gain stage to adjust a gain of the input gain stage in response thereto; and
    an output gain stage operably coupled to the overload management module and an output of the analog-to-digital converter, wherein the overload management module is arranged to provide a control signal to the output gain stage to adjust a gain of the output gain stage in response to whether the received, amplified analog input signal exceeds an operating range of the analog-to-digital converter.

12. The automatic gain control circuit of claim 11 wherein the overload management module is arranged to provide a control signal to the output gain stage to effect a reciprocal gain of the output gain stage to the gain of the input gain stage.

13. The automatic gain control circuit of claim 11 further comprising a digital filter located between the analog-to-digital converter and the output gain stage.

14. The automatic gain control circuit of claim 13 further comprising a delay module operably coupled between the overload management module and the output gain stage and arranged to delay the control signal to the output gain stage to compensate for signal propagation latency introduced by the digital filter.

15. An automatic gain control circuit comprising:
    a first input gain stage for receiving and amplifying an analog input signal;
    an analog-to-digital converter for receiving the amplified analog input signal and providing a digital output signal; and
    an overload management module arranged to:
       receive the digital output signal from the analog-to-digital converter;
       determine therefrom whether the received, amplified analog input signal exceeds an operating range of the analog-to-digital converter; and
       provide a first control signal to the first input gain stage to adjust a gain of the first input gain stage in response thereto, wherein the overload management module is arranged to further provide a feedback automatic gain control signal to a second input gain stage of a second global automatic gain control loop located outside of a first inner automatic gain control loop located around the analog-to-digital converter, wherein the first input gain stage is located at the first inner automatic gain control loop.

16. The automatic gain control circuit of claim 15 wherein the overload management module is arranged, upon determining that amplified analog input signal exceeds an operating range of the converter, to generate an overload indicator signal that functions in at least one from a group comprising:
   indicates the amplified analog input signal exceeds an operating range of the analog-to-digital converter;
   is used as an interrupt signal;
   identifies to the second global automatic gain control loop that the source of the exceeding analog input signal is located before the first input gain stage.

17. The automatic gain control circuit of claim 16 wherein the overload management module is arranged, upon determining that amplified analog input signal no longer exceeds an operating range of the analog-to-digital converter indicating that the global AGC loop has taken action to reduce a gain of a stage preceding the analog-to-digital converter, to generate an overload clear signal to remove an overload condition.

18. A method for providing automatic gain control, the method comprising:
   receiving and amplifying an analog input signal at an input gain stage of an automatic gain control circuit;
   performing analog-to-digital conversion of the amplified analog input signal; and
   receiving a digital output signal directly from the analog-to-digital conversion;
      determining therefrom whether the received, amplified analog input signal exceeds an operating range of the analog-to-digital converter; and
      providing a control signal directly to the input gain stage; and
   adjusting a gain of the input gain stage in response to the determination.

19. A non-transitory computer program product comprising executable code stored therein for calibrating a power detector, the executable code operable for performing the method of claim 18.

* * * * *